United States Patent
Chen et al.

(10) Patent No.: US 7,379,327 B2
(45) Date of Patent: May 27, 2008

(54) CURRENT DRIVEN SWITCHING OF MAGNETIC STORAGE CELLS UTILIZING SPIN TRANSFER AND MAGNETIC MEMORIES USING SUCH CELLS HAVING ENHANCED READ AND WRITE MARGINS

(75) Inventors: Eugene Youjun Chen, Fremont, CA (US); Yiming Huai, Pleasanton, CA (US); Alex Fischer Panchula, San Carlos, CA (US); Lien-Chang Wang, Fremont, CA (US); Xiao Luo, Cupertino, CA (US)

(73) Assignees: Grandis, Inc., Milpitas, CA (US); Renesas Technology Corp., Tokyo (JP)

( * ) Notice: Subject to any disclaimer, the term of this patent is extended or adjusted under 35 U.S.C. 154(b) by 132 days.

(21) Appl. No.: 11/476,171

(22) Filed: Jun. 26, 2006

(65) Prior Publication Data

US 2007/0297223 A1    Dec. 27, 2007

(51) Int. Cl.
*G11C 11/00* (2006.01)
(52) U.S. Cl. ................. 365/158; 365/171; 365/173
(58) Field of Classification Search ............... 365/158, 365/171, 173
See application file for complete search history.

(56) References Cited

U.S. PATENT DOCUMENTS

| 6,055,178 | A | 4/2000 | Naji |
| 6,445,612 | B1 | 9/2002 | Naji |
| 6,757,191 | B2 | 6/2004 | Ooishi et al. |
| 6,940,749 | B2 | 9/2005 | Tsang |
| 7,283,384 | B1 * | 10/2007 | Jenne et al. ............... 365/158 |
| 7,286,395 | B2 * | 10/2007 | Chen et al. ............... 365/158 |

OTHER PUBLICATIONS

DeBrosse, John et al., "A High-Speed 128-kb MRAM Core for Future Universal Memory Applications," IEEE Journal of Solid-State Circuits, Apr. 2004, vol. 39, No. 4, pp. 678-683.
Huai, Yiming et al., "Observation of Spin-Transfer Switching in Deep Submicron-Sized and Low-Resistance Magnetic Tunnel Junctions," Appl. Phys. Lett., 84, 3118, 2004, pp. 1-3.

(Continued)

*Primary Examiner*—Pho M. Luu
(74) *Attorney, Agent, or Firm*—Strategic Patent Group, P.C.

(57) ABSTRACT

A method and system for providing a magnetic memory. The magnetic memory includes magnetic storage cells in an array, bit lines, and source lines. Each magnetic storage cell includes at least one magnetic element. The magnetic element(s) are programmable by write currents driven through the magnetic element(s). Each magnetic element has free and pinned layer(s) and a dominant spacer. The magnetic memory is configured such that either the read current(s) flow from the free layer(s) to the dominant spacer if the maximum low resistance state read current divided by the minimum low resistance state write current is greater than the maximum high resistance state read current divided by the minimum high resistance state write current or the read current(s) flow from the dominant spacer to the free layer(s) if the maximum low resistance state read current divided by the minimum low resistance state write current is less than the maximum high resistance state read current divided by the minimum high resistance state write current.

25 Claims, 9 Drawing Sheets

OTHER PUBLICATIONS

Diao, Zhitao et al., "Spin Transfer Switching and Spin Polarization in Magnetic Tunnel Junctions with MgO and AlO$_x$ Barriers," Appl. Phys. Lett., 87, 2005, pp. 232502-1-232502-3.

Zhenghong, Qian et al., "Circuitry for Use in Current Switching a Magnetic Cell," U.S. Appl. No. 11/096,626, filed Mar. 31, 2005, 32 pgs.

Diao, Zhitao et al., "Fast Magnetic Memory Devices Utilizing Spin Transfer and Magnetic Elements Used Therein," U.S. Appl. No. 11/147,944, filed Jun. 8, 2005, 65 pgs.

Wang, Lien-Chang et al., "Magnetic Devices Having a Hard Bias Field and Magnetic Memory Devices Using the Magnetic Devices," U.S. Appl. No. 11/192,811, filed Jul. 29, 2005, 39 pgs.

Chen, Eugene Youjun et al., "Current Driven Switching of Magnetic Storage Cells Utilizing Spin Transfer and Magnetic Memories Using Such Cells," U.S. Appl. No. 11/217,258, filed Aug. 31, 2005, 64 pgs.

Chen, Eugene Youjun et al., "Current Driven Switching of Magnetic Storage Cells Utilizing Spin Transfer and Magnetic Memories Using Such Cells," U.S. Appl. No. 11/217,524, filed Aug. 31, 2005, 59 pgs.

Chen, Eugene Youjun et al., "Current Driven Switched Magnetic Storage Cells Having Improved Read and Write Margins and Magnetic Memories Using Such Cells," U.S. Appl. No. 11/260,778, filed Oct. 27, 2005, 45 pgs.

Wang, Lien-Chang et al., "Method and System for Providing Current Balanced Writing for Memory Cells and Magnetic Devices," U.S. Appl. No. 11/286,083, filed Nov. 23, 2005, 38 pgs.

Chen, Eugene Youjun et al., "Current Driven Memory Cells Having Enhanced Current and Enhanced Current Symmetry," U.S. Appl. No. 11/361,267, filed Feb. 24, 2006, 47 pgs.

Lu, Xiao et al., "Method and System for Providing a Magnetic Memory Structure Utilizing Spin Transfer," U.S. Appl. No. 11/446,391, filed Jun. 1, 2006, 40 pgs.

* cited by examiner

CURRENT DRIVEN SWITCHING OF MAGNETIC STORAGE CELLS UTILIZING SPIN TRANSFER AND MAGNETIC MEMORIES USING SUCH CELLS HAVING ENHANCED READ AND WRITE MARGINS

FIELD OF THE INVENTION

The present invention relates to magnetic memory systems, and more particularly to a method and system for providing a memory, magnetic storage cells and/or read and/or write schemes having an improved read and write margins for current based switching.

BACKGROUND OF THE INVENTION

Figure 1:
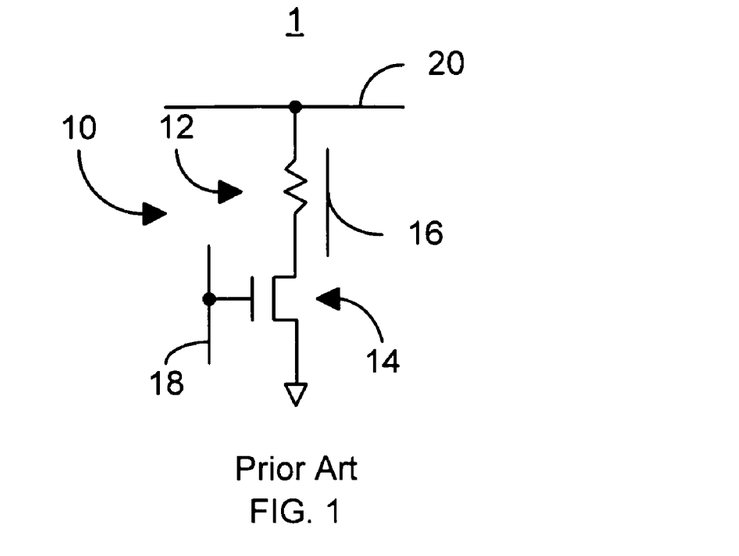
FIG. 1 is a diagram of a portion of a portion conventional magnetic random access memory.

FIG. 1 depicts a small portion of a conventional magnetic random access memory (MRAM) 1. The conventional MRAM 1 includes a magnetic storage cell 10 having a conventional magnetic element 12 that is typically a conventional magnetic tunneling junction (MTJ) 12, and a conventional read selection transistor 14. Also depicted are a conventional write word line 16, a conventional read word line 18, and a conventional bit line 20. Data is stored in the conventional magnetic element 12 by programming the conventional magnetic element to be in a high resistance state or a low resistance state. This programming is typically performed by applying magnetic fields from current pulses flowing in both the conventional bit line 20 and the conventional write word line 16. The conventional magnetic element 12 is read by activating the read selection transistor 14 using the read word line 18 and driving a read current through the conventional magnetic element.

Figure 2:
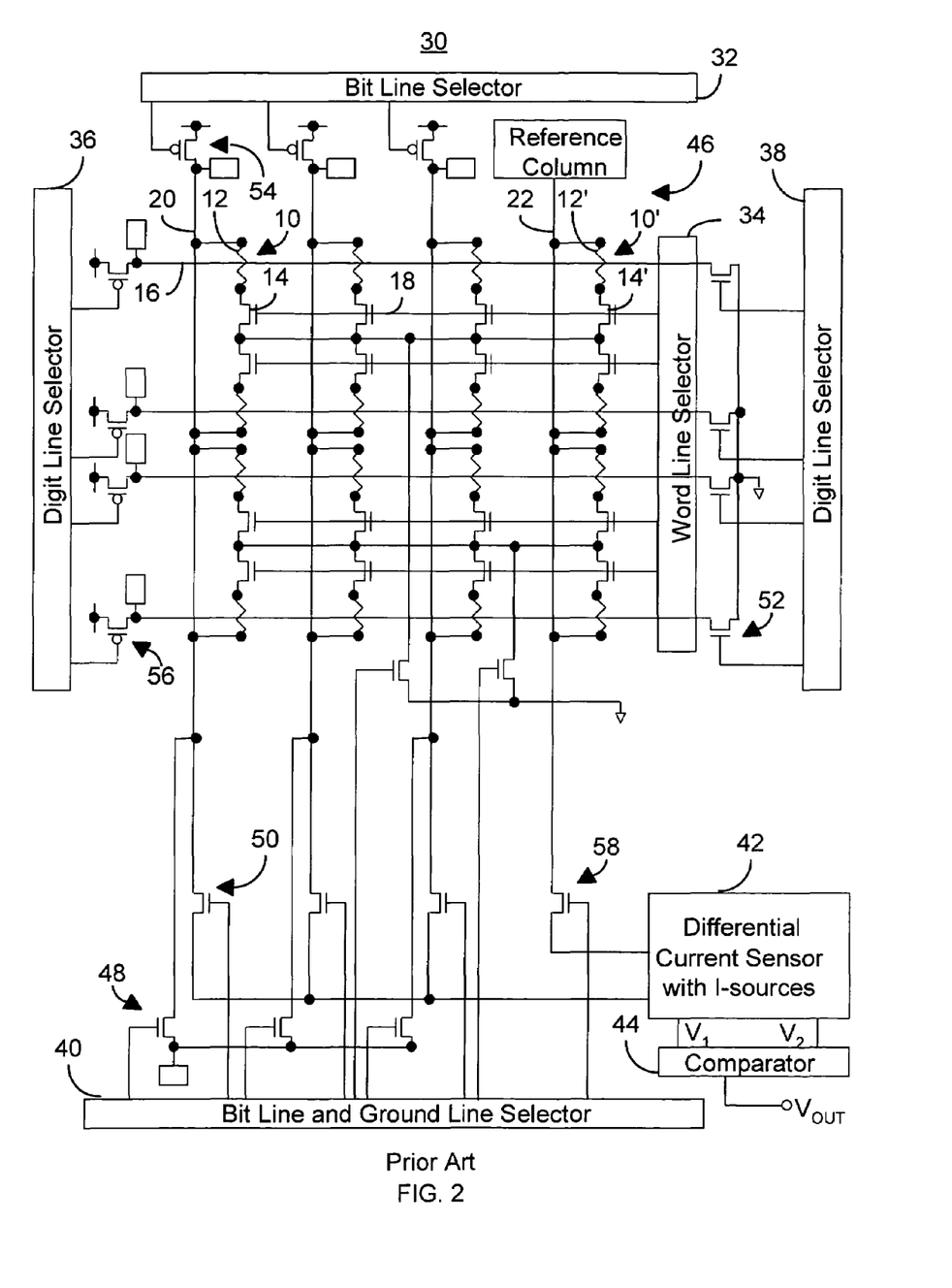
FIG. 2 is a diagram of a portion of a conventional magnetic random access memory.

FIG. 2 depicts a larger portion of a conventional MRAM array 30 which uses multiple conventional memory cells, such as the conventional magnetic storage cell 10 depicted in FIG. 1. Referring back to FIG. 2, the conventional magnetic storage cells 10 are arranged in rows and columns. The conventional magnetic storage cells 10 are still associated with conventional read word lines 18, conventional write word lines 16, and conventional bit lines 20. Also depicted are bit line selector 32, word line selector 34, first digit line selector 36, second digit line selector 38, bit and ground line selector 40, differential current sensor with current sources 42, comparator 44, reference column 46 having storage cells 10' corresponding to the storage cells 10 and bit line 22 corresponding to the bit lines 20, and switches 48, 50, 52, 54, 56, and 58. The conventional read word lines 18 are connected to the word line selector 34. Each conventional write word line 16, which may also be termed a digit line, is connected to first and second digit line selectors 36 and 38, respectively. Read word lines 18, and write word lines 16 run horizontally, while bit lines 20, which also serve as data lines, run vertically. The bit lines 20 are connected to first and second bit line selectors 32 and 40. The transistor switches 48, 50, 52, 54, 56, and 58, at the ends of the lines 16, 18, 20, and 22 connect the lines 16, 18, 20, and 22 to voltage sources, such as the power supply or ground.

During a write operation, a conventional bit line 20 supplying a portion of the magnetic field required for switching (termed the switching field) the magnetic element 12 is activated. In addition, a corresponding horizontal, conventional write word line 16 supplying remaining portion of the switching field is activated. Ideally, neither the magnetic field generated using the bit line 20 (bit line field), nor the magnetic field generated by the write word line 16 (digit line field) is alone sufficient to program any conventional magnetic element 12. However, in combination the bit line 20 and the write word line 16 can generate the switching field at their cross point. Consequently, a selected conventional magnetic element 12 can be written.

During a read operation, a conventional read word line 18 and a conventional bit line 20 containing the magnetic element to be read are activated. Only the conventional magnetic storage cell 10 at the cross point between the activated bit line 20 and the activated read word line 18 is read. The resistance state of the conventional magnetic storage cell being read is compared to the reference cell 10' by the differential current sensor 42 and the comparator 44, which compares the two current signals and produces an output Vout for memory state "1" or "0".

One of ordinary skill in the art will readily recognize that the conventional MRAM 30 using the conventional magnetic storage cell 10 has several drawbacks. During writing, magnetic storage cells 10 along the same conventional bit line 20 or the conventional write word line 16 as the magnetic storage cell 10 being written are also exposed to the bit line or digit line fields. These fields, coupled with a large distribution in the switching fields for conventional magnetic storage cells 10 in a large memory array 30, can cause unintentional error writing. As a result, performance of the conventional MRAM 10 suffers. This problem may be solved by using an advanced architecture called toggle writing. However, toggle writing requires much higher magnetic field, which utilizes a significantly higher current. This significantly increases the power consumption of the MRAM 10. Moreover, toggle writing requires a read verification prior to actual writing, thus making the total access time longer, making it unattractive for high speed embedded applications. The current generation memory cell size for conventional MRAM including toggle writing MRAM is close to $40F^2$ with F being the lithography critical dimension. They are competitive with semiconductor memory SRAM in density, yet MRAM may cost more since they use five to seven more masks than SRAM.

Furthermore, for the conventional magnetic element 12 written using an applied field, the current required to generate the switching field increases as the width of the conventional magnetic element 12 decreased. Consequently, power consumption is greatly increased, particularly for a smaller magnetic element 12 in a higher density memory. This increased power consumption is undesirable. A major drawback for conventional MRAM, including toggle writing MRAM, is its switching current scaling property. Consequently, another mechanism for providing an MRAM is desired.

Figure 3:
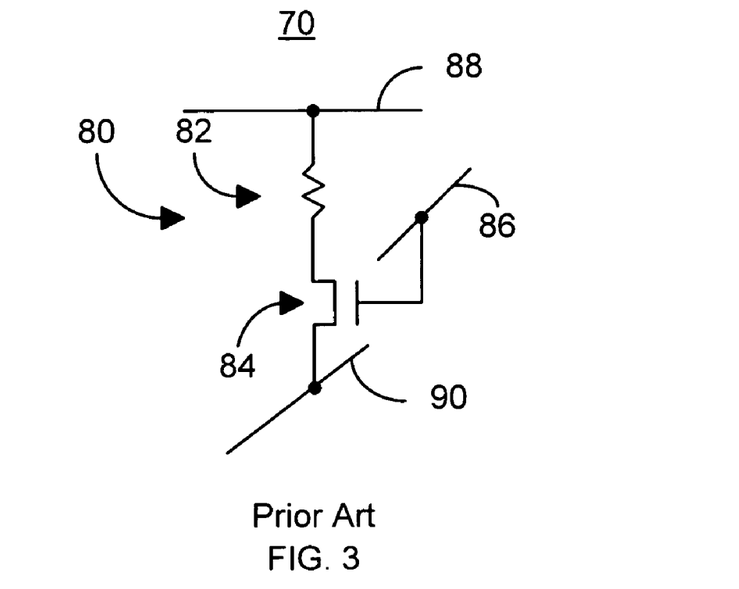
FIG. 3 is a diagram of a magnetic memory utilizing spin transfer in switching.

FIG. 3 depicts a small portion of a conventional spin transfer torque random access memory (STT-RAM) 70. The STT-RAM 70 includes a conventional magnetic storage cell 80 including a conventional magnetic element 82 and a selection device 84 that is preferably an isolation transistor 84, word line 86, bit line 88, and source line 90. The word line 86 is oriented perpendicular to the bit line 88. However, the source line 90 is typically either parallel or perpendicular to the bit line 88, depending on specific architecture used for the STT-RAM 70.

The conventional magnetic element is typically a magnetic tunneling junction (MTJ) and is configured to be changeable between high and low resistance states by driving a spin polarized current through the conventional MTJ 82. The spin polarized current changes state of the conventional MTJ 82 using spin transfer torque switching effect. Typically, this is achieved by ensuring that the MTJ 82 has a sufficiently small cross-sectional area and that the layers of the MTJ have particular thicknesses. When the current density is sufficient, the current carriers driven through the conventional magnetic element 82 may impart sufficient torque to change the state of the conventional magnetic element 82. When a write current is driven in one direction, the state may be changed from a low resistance state to a high resistance state. When the write current is driven in the opposite direction, the state may be changed from a high resistance state to a low resistance state.

In order to program the conventional storage cell 80, the bit line 88 and the word line 86 are activated. A current is driven between the source line 90 and the bit line 88. To program the conventional MTJ 82 to a first state, a high voltage is supplied to the bit line 88 and a low voltage, such as ground, is supplied to the source line 90. Thus, the write current passes from the bit line 88 to the conventional MTJ 82 and then the source line 90. To program the conventional MTJ 82 to a second state, a high voltage is supplied to the source line 90 and a low voltage, such as ground, is supplied to the bit line 88. Thus, the write current passes from the source line 90 to the conventional MTJ 82, and then the bit line 88.

For a read operation, the bit line 88 and the word line 86 are activated. Consequently, the selection device 84 is turned on. A read current is driven through the conventional magnetic element 82. The read current may be provided by a differential current sensor analogous to the differential current sensor 42 depicted in FIG. 2. Referring back to FIG. 3, the read current is thus provided to the bit line 88, which may have its bias voltage clamped. As a result, a high magnetoresistive signal can be obtained during sensing. In some conventional spin RAM, a reference cell (not shown in FIG. 3) may be used. In such a conventional spin RAM, a portion of the read current is provided to the conventional magnetic storage cell 80 being read and a portion of the current is provided to the reference cell. Thus, the current being sensed during a read operation is the difference between a constant supply current and the current that actually flows through the MTJ element. A comparator that is analogous to the comparator 44 of FIG. 2, compares the output of the differential current sensor to determine the state of the conventional magnetic storage cell 80. Thus, the conventional magnetic storage cell 80 can be programmed and read.

Thus, the conventional spin RAM 70 utilizes a write current driven through the magnetic element 82 in order to program data to the conventional magnetic storage cell 80. Thus, the conventional spin RAM 70 uses a more localized phenomenon in programming the conventional magnetic element 82. Furthermore, for smaller magnetic elements 82 and, therefore, higher memory densities, the conventional spin RAM 70 uses a lower current.

Figure 4:
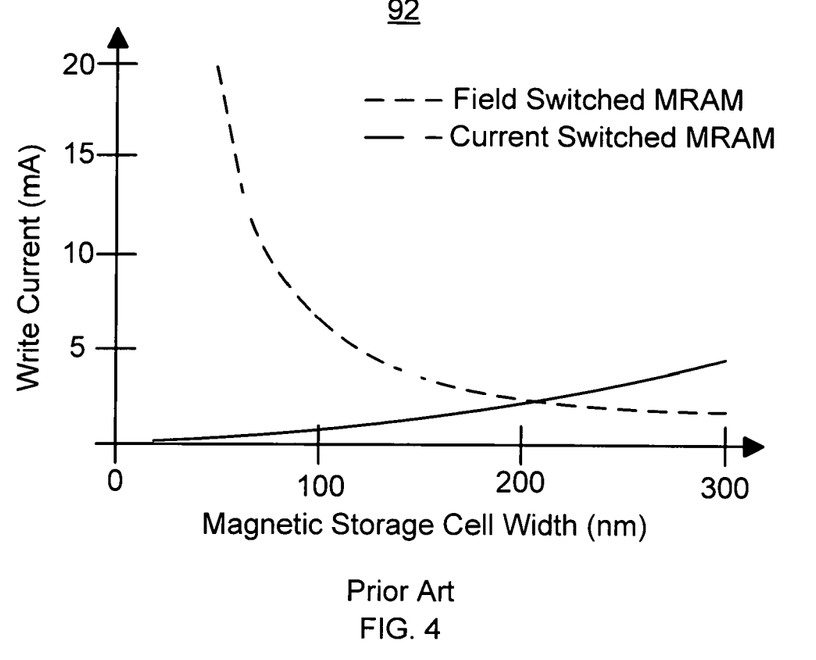
FIG. 4 is a graph depicting a comparison between the write current for the conventional magnetic field switched MRAM and for the conventional STT-RAM.

FIG. 4 is a graph 92 depicting a comparison between the write current for the conventional magnetic field switched MRAM 30 and for the conventional STT-RAM 70. Note that the write current for toggle writing MRAM is higher than the current in FIG. 4. For a conventional magnetic MTJ 12/82 having width less than two hundred nanometers, the current required for the conventional STT-RAM 70 is lower than that for conventional MRAM 30 and keeps decreasing as width decreases, of example for future generation technology. This is in contrast to the conventional MRAM 30, which has a write current that increases as the dimensions of the conventional MTJ 12 shrinks. Toggle writing for the conventional MRAM 30 requires even higher writing currents than conventional MRAM. Higher writing current means higher power consumption, larger memory cell and memory chip size and more reliability problems such as electro-migration. Thus STT-RAM 70 has the desired current scaling trend. Moreover, unlike conventional MRAM 30, the conventional STT-RAM 70 does not suffer from a half select write disturb problem because the conventional STT-RAM 70 is written by a current flowing only through the cell 80 being written.

Figure 5:
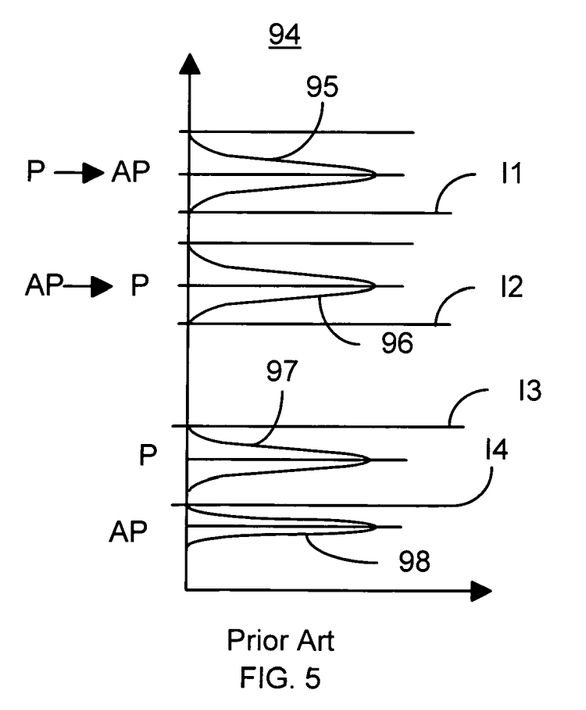
FIG. 5 is a graph depicting conventional STT-RAM write and read current distributions.

FIG. 5 is a graph 94 depicting write and read current distributions. Although the conventional STT-RAM 70 does not have a half select write disturb problem, there may be read disturb issues which may be illustrated in FIG. 5. The current distribution 96 is a write current distribution for switching the antiparallel (high resistance) state of the magnetic element 82 to the parallel (low resistance) state of the magnetic element 82. The current distribution 95 is a write current distribution for switching from the parallel state of the conventional magnetic element 82 to the antiparallel state of the conventional magnetic element 82. The current distribution 97 is the read current distribution for the parallel or low resistance state. The current distribution 98 is the read current distribution for the antiparallel or high resistance state. In addition, a conventional STT-RAM 70 has not one, but many magnetic storage cells 80. Process variations may cause the write and read currents of the magnetic elements 82 within a conventional spin RAM 70 to have a distribution range. Consequently, the distributions 95, 96, 97, and 98 are depicted as having a range. Moreover, each write current distribution 95 and 96 has a minimum write current I1 and I2, respectively. In general, most memory cells may be written at write currents above the currents I1 or I2. Furthermore, each read current distribution 97 and 98 has a maximum read current I3 and I4, respectively. Most cells can be read for read currents less than I3 or I4. However, it may be noted that there may be a few magnetic storage cells 80 that may not be written to the antiparallel state at currents outside of the distribution 95 as well as magnetic storage cells 80 that may not be written to the parallel state even at currents outside of the distribution 96. These magnetic storage cells 80 are called tail distribution bits, or outliers. In general, the difference between the maximum reading current I3 or I4 and the minimum writing current I1 or I2 represents the reading and writing margin.

High speed memory operation requires high read current difference between the two different memory states. The state of the art magnetic element 82 has a magnetoresistance (MR) ratio of approximately one hundred to one hundred fifty percent at an operating voltage range of approximately one hundred fifty to five hundred millivolts. Therefore, high read current difference comes from a high read current and a high MR ratio. As discussed above, a smaller transistor 84 would require a lower STT-RAM write current. Consequently, the difference between write currents 95 and 96 and read currents 97 and 98 is narrowed for higher density STT-RAMs 70 having smaller cell 80 sizes as well as for higher speed and larger read signals. In addition to process variation caused distribution, thermal effects may also cause variations in read and/or write currents. During the full life of a Mega- to Giga-bits memory chip operation, even a much lower read current 97 or 98 may accidentally switching or writing a bit due to thermal assisted switching. Consequently, the write and read margins may be even smaller. Thus, the possibility of data being compromised during a read operation might be even further increased.

In addition to reduced write and read margins for the conventional STT-RAM 70, to realize the potential benefits of the conventional STT-RAM 70 and allow this technology to be competitive with general semiconductor memory such as SRAM, DRAM and Flash, a number of parameters are desired to be optimized for STT-RAM. The writing current of conventional STT-RAM 70 is desired to be reduced further. A lower write current allows a smaller isolation transistor 84 per magnetic storage cell 80 to control the write current. Consequently, a smaller magnetic storage cell 80, and a higher density memory may be provided.

Accordingly, what is desired is a method and system for providing and utilizing memory cells employing spin transfer based switching with improved read and write margin, or reduced reading current induced accidental writing error. The present invention addresses such a need.

BRIEF SUMMARY OF THE INVENTION

The present invention provides a method and system for providing a magnetic memory. The magnetic memory comprises magnetic storage cells in an array, bit lines, and source lines. Each magnetic storage cell includes at least one magnetic element. The magnetic element(s) are programmable by at least one write current driven through the magnetic element(s). Each of the magnetic element(s) has at least one free layer, a dominant spacer, and at least one pinned layer. The magnetic storage cells have a maximum high resistance state read current, a maximum low resistance state read current, a minimum high resistance state write current, and a minimum low resistance state write current. The magnetic storage cells are read by read current(s). The magnetic storage cells, the source lines and the bit lines are configured such that at least one of: the read current(s) flow from the free layer(s) to the dominant spacer if the maximum low resistance state read current divided by the minimum low resistance state write current is greater than the maximum high resistance state read current divided by the minimum high resistance state write current and the read current(s) flow from the dominant spacer to the at least one free layer if the maximum low resistance state read current divided by the minimum low resistance state write current is less than the maximum high resistance state read current divided by the minimum high resistance state write current.

In addition, in some embodiments, the magnetic memory also includes a plurality of reference cells. The reference cells may be analogous to the memory cells. In one embodiment, the reference cells are arranged in columns, which may be electrically connected to provide an intermediate resistance. The plurality of reference cells may also be used to replace magnetic storage cells that have a write current that is either higher or lower than a mean current by a particular amount.

According to the method and system disclosed herein, the present invention provides a mechanism for programming and reading a magnetic memory that provides a higher read and write margin.

DETAILED DESCRIPTION OF THE INVENTION

The present invention relates to a magnetic memory. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for providing a magnetic memory. The magnetic memory comprises magnetic storage cells in an array, bit lines, and source lines. Each magnetic storage cell includes at least one magnetic element. The magnetic element(s) are programmable by at least one write current driven through the magnetic element(s). Each of the magnetic element(s) has at least one free layer, a dominant spacer, and at least one pinned layer. The magnetic storage cells have a maximum high resistance state read current, a maximum low resistance state read current, a minimum high resistance state write current, and a minimum low resistance state write current. The magnetic storage cells are read by read current(s). The magnetic storage cells, the source lines and the bit lines are configured such that at least one of: the read current(s) flow from the free layer(s) to the dominant spacer if the maximum low resistance state read current divided by the minimum low resistance state write current is greater than the maximum high resistance state read current divided by the minimum high resistance state write current and the read current(s) flow from the dominant spacer to the at least one free layer if the maximum low resistance state read current divided by the minimum low resistance state write current is less than the maximum high resistance state read current divided by the a minimum high resistance state write current.

In addition, in some embodiments, the magnetic memory also includes a plurality of reference cells. The reference cells may be analogous to the memory cells. In one embodiment, the reference cells are arranged in columns, which may be electrically connected to provide an intermediate resistance. The plurality of reference cells may also be used to replace magnetic storage cells that have a write current that is either higher or lower than a mean current by a particular amount.

The present invention is described in the context of particular magnetic memories having certain components, such magnetic storage cells having magnetic elements including particular components and particular isolation devices. One of ordinary skill in the art will readily recognize that the present invention is consistent with the use of magnetic memories having other and/or additional components. Furthermore, the present invention is described in the context of components corresponding to certain portions of the memory. The method and system in accordance with the present invention are also described in the context of reading from or writing to a single magnetic storage cell. However, one of ordinary skill in the art will readily recognize that the method and system can be extended to read from and/or write to multiple magnetic storage cells substantially in parallel. Finally, the present invention is described in the context of certain memories. However, one of ordinary skill in the art will readily recognize that the present invention is compatible with memories and other devices not inconsistent with the present invention.

Figure 6:
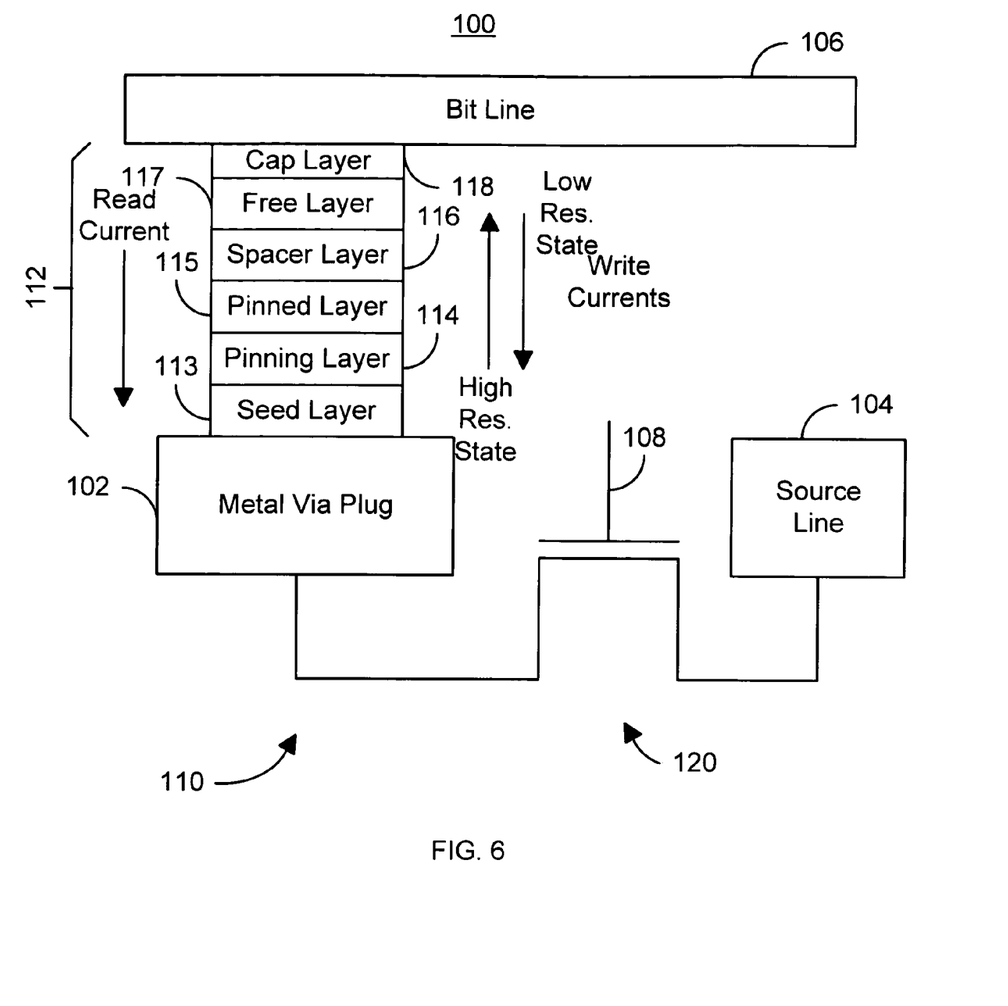
FIG. 6 is a diagram of a portion of one embodiment of a magnetic memory in accordance with the present invention having improved read and write margins

FIG. 6 is a diagram of a portion of one embodiment of a magnetic memory 100 in accordance with the present invention having improved read and write margins. The magnetic memory 100 is an STT-RAM. Thus, the STT-RAM 100 includes magnetic storage cells such as the magnetic storage cell 110, bit line 106, and source line 104. The magnetic storage cell 110 includes a magnetic element 112 and a selection device 120. The magnetic element 112 has a free layer 117, a dominant spacer layer 116, and a pinned layer 115. The magnetic element 112 also preferably includes a seed layer 113, a pinning layer 114, and a capping layer 118. In another embodiment, the magnetic element 112 may have other layers. The dominant spacer layer 116 is preferably a barrier layer 116. The dominant spacer layer 116 is considered dominant because it has the largest contribution to the resistance of the magnetic element 112. The pinned layer 115 may be a synthetic antiferromagnet which includes two magnetic layers separated by a non-magnetic spacer such as Ru. The free layer 117 may be a single magnetic layer, or a synthetic antiferromagnet. The magnetic element 112 is programmed using the spin transfer effect by passing a current through the magnetic element 112. Depending on the direction of the write current, the magnetic element 112 may be programmed to a different state.

The STT-RAM 100 includes multiple storage cells 110. Consequently, the magnetic elements such as the magnetic element 112 of the STT-RAM 100 have a distribution of write and read currents. Consequently, the current distributions 95, 96, 97, and 98 depicted in FIG. 5 describe the magnetic elements 112 of the STT-RAM 100. Referring to FIGS. 5 and 6, the magnetic element 112 is written to one (high) resistance state by currents in the current distribution 95. Similarly, the magnetic element 112 may be written to another (low) resistance state by currents in the current distribution 96. The low and high resistance states may be read using currents in the read current distributions 97 and 98, respectively. Furthermore, the magnetic element 112, and thus the magnetic storage cell 110 may be characterized by a maximum high resistance state read current I4, a maximum low resistance state read current I3, a minimum high resistance state write current I1, and a minimum low resistance state write current I2. In addition, the magnetic storage cell 110, the source line 104 and the bit line 106 are configured such that at least one of two situations occurs. First, the read current is driven from the free layer 117 to the dominant spacer 116 and thus the pinned layer 115 if the maximum low resistance state read current I3 divided by the minimum high resistance state write current I1 is greater than the maximum high resistance state read current I4 divided by the minimum low resistance state write current I2, or I3/I1>I4/I2. Second, the read current flows from the pinned layer 115 to the dominant spacer 116 and to the free layer 117 if the maximum low resistance state read current I3 divided by the minimum high resistance state write current I1 is less than the maximum high resistance state read current I4 divided by the minimum low resistance state write current I2, or I3/I1<I4/I2. Thus, the direction of the read current is selected based upon the ratios between the read and write currents for the high and low resistance states.

In the STT-RAM 100, the magnetic element 112 is programmed to a low resistance state by passing a write current from the bit line 106 to the source line 104. Thus, the write current for the low resistance state travels from the free layer 117, through the dominant spacer layer 116, to the pinned layer 115. To program the magnetic element into a high resistance state, a write current is passed from the pinned layer 115, through the dominant spacer layer 116, to the free layer 117. In the embodiment shown, the maximum low resistance state read current I3 divided by the minimum high resistance state write current I1 is greater than the maximum high resistance state read current I4 divided by the minimum low resistance state write current I2 (I3/I1>I4/I2).

The direction selected for the read current with respect to the write current can be understood as follows. In general, the write currents for writing from the low to the high resistance states in current distribution 95 are higher than the write currents for writing from the high to the low resistance states in the current distribution 96. However, in certain structures, these current distributions 95 and 96 may be close to each other. Similarly, the read currents 97 for the low state are generally higher than the read currents 98 for the high state. This is because in the high resistance state, in which the magnetizations of the free layer 117 and pinned layer 115 are antiparallel, its higher resistance allows a lower read current to be used. Although the write currents in the distributions 95 and 96 are driven in opposite directions, the read currents in the distribution 97 and 98 are in the same direction. Thus, the read current in the distribution 97 and 98 is either in the same direction as the write current to program the magnetic element 112 to the high resistance state (distribution 95) or in the same direction as the write current to program the magnetic element 112 to the low resistance state (distribution 96). If the read current is driven through the magnetic element 112 in the same direction as the write current for the low resistance state (distribution 96), the read current for the low resistance state (distribution 97) reinforces the low resistance state. Stated differently, in such a case, the read current for the low resistance would tend to write the magnetic element into the low resistance state. Thus, in this case, the read current in the distribution 97 would tend not to disturb the state of the magnetic element 112. In this situation, the read current for the high resistance state in the distribution 98 is in the opposite direction for the write current 95 to the high resistance state. Consequently, the read current would tend to disturb the high resistance state of the magnetic storage cell 110. The probability of disturbance is determined by the ratio between I4 and I2. In contrast, if the read current is driven through the magnetic element 112 in the same direction as the write current for the high resistance state (distribution 95), then the read current for the high resistance state (distribution 98) reinforces the high resistance state. Thus, the read current for the distribution 98 would tend not to disturb the state of the magnetic element 112. Also in this situation, the read current for the low resistance state (distribution 97) is in the opposite direction for the write current to the low resistance state (distribution 96). Thus, reading the low resistance state disturbs the state of the magnetic element. The disturb probability is determined by the ratio between I3 and I1. Depending on the comparison between I4/I2 and I3/I1, the STT-RAM bit cell structure can be optimized to minimize read disturb probability.

In the embodiment depicted in FIG. 6, the read current is driven from the bit line 106 to the source line 104. In a preferred embodiment, the voltage of the bit line 106 is voltage clamped at a constant voltage while the source line 104 is set at a lower voltage, such as ground voltage. The voltage difference between the bit line 106 and the source lien 104 is distributed between the magnetic element 112 and the transistor 120. Thus, for a voltage VBL at the bit line 106, VSL at the source line 104, a voltage across the magnetic element 112 of Vread, a voltage at the metal via plug 102 of Vplug, and a transistor voltage of Vt, the voltage for the bit line 106 is chosen such that the bias voltage (Vread) on the magnetic element 112 (VBL-Vplug) is in the range of one hundred to five hundred millivolts, where the magnetic element 112 has the largest signal output. When Vread is applied to the magnetic element 112, the current flowing through the magnetic element 112 is in the distribution 97 if the magnetic element 112 is in its low resistance state. Similarly, when Vread is applied to the magnetic element 112, the current flowing through the magnetic element is in the distribution 98 if the magnetic element 112 is in its high resistance state. As shown in FIG. 5, the distribution 97 is much higher than the distribution 98, because the maximum resistance for the antiparallel (high resistance) state is generally more than twice the minimum resistance for the parallel (low resistance) state. The spin torque produced by the reading current in the distribution 97 reinforces the minimum resistance state if the magnetization of the free layer 117 is parallel with the magnetization of the pinned layer 115. Only the much lower reading current for the distribution 98 produces a spin torque which tends to destabilize the maximum resistance state. The read disturb error rate is determined by the lower ratio of I4/I2. Thus the margin between the writing and reading current is increased for the STT-RAM 100.

Figure 7:
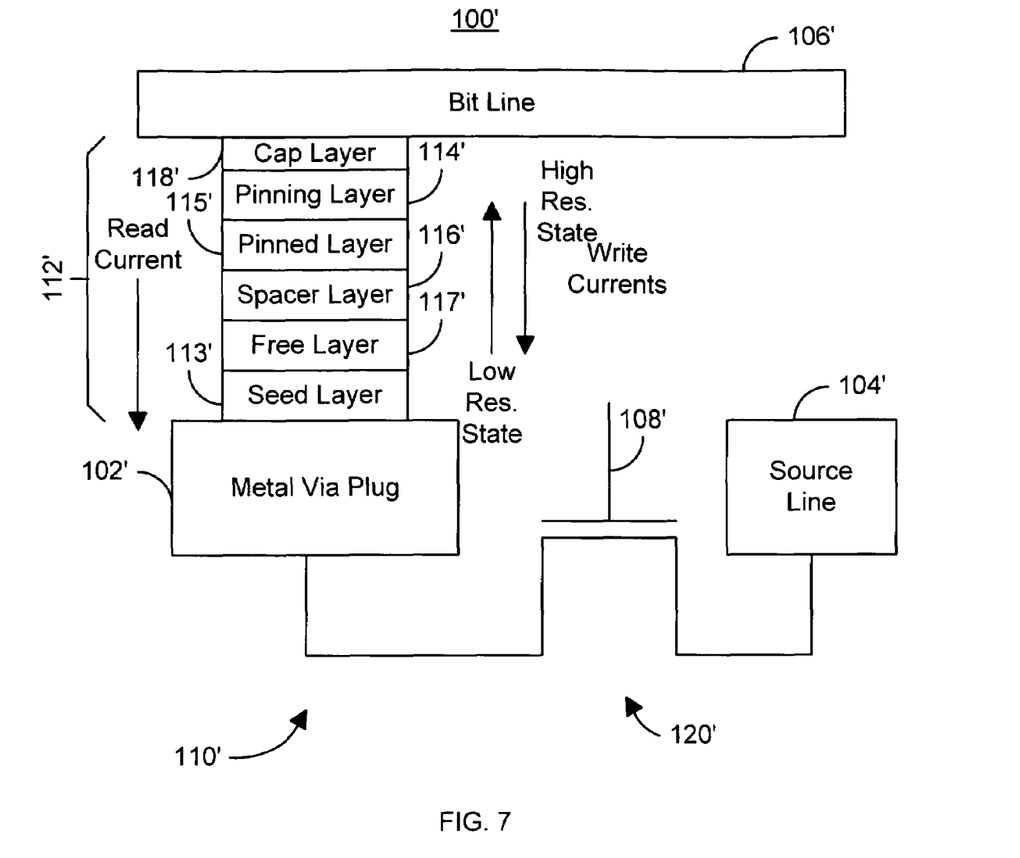
FIG. 7 is a diagram of a portion of another embodiment of a magnetic memory in accordance with the present invention having improved read and write margins.

FIG. 7 is a diagram of a portion of another embodiment of a magnetic memory 100' in accordance with the present invention having improved read and write margins. The magnetic memory 100' is an STT-RAM and is analogous to the STT-RAM 100. Consequently, analogous components are labeled similarly. Thus, the STT-RAM 100' includes components such as the magnetic storage cell 110', bit line 106', and source line 104'. The magnetic storage cell 110' includes a magnetic element 112' and a selection device 120'. The magnetic element 112' has a free layer 117', a dominant spacer layer 116', and a pinned layer 115'. The magnetic element 112' also preferably includes a seed layer 113', a pinning layer 114', and a capping layer 118'. In another embodiment, the magnetic element 112' may have other layers. The dominant spacer layer 116' is preferably a barrier layer 116'. The magnetic element 112' is programmed using the spin transfer effect by passing a current through the magnetic element 112'. Depending on the direction of the write current, the magnetic element 112' may be programmed to a different state. Like the STT-RAM 100, the graph 94 also applies to the STT-RAM 100'. Referring to FIGS. 5 and 7, in the embodiment shown, the maximum low resistance state read current I3 divided by the minimum high resistance state write current I1 is less than the maximum high resistance state read current I4 divided by the minimum low resistance state write current I2 (I3/I1<I4/I2).

In the STT-RAM 100', the read current is driven from the bit line 106' to the source line 120'. In addition, I3/I1<I4/I2. Consequently, the magnetic element 112' has the free layer 117' at bottom, the pinned layer 115' at the top, and the dominant spacer layer 116' in between. The pinned layer 115' may be a synthetic antiferromagnet with two magnetic layers separated with a non-magnetic spacer such as Ru. The free layer 117' may be a synthetic antiferromagnet with two magnetic layers separated with a non-magnetic spacer such as Ru.

The STT-RAM 100' functions in an analogous manner to the STT-RAM 100. The magnetic element 112' is programmed using the spin transfer effect by passing a current through the magnetic element 112'. To program the magnetic element into a low resistance state, a write current is passed from the free layer 117', through the dominant spacer layer 116', to the pinned layer 115'. To program the magnetic element 112' into a high resistance state, a write current is passed from the pinned magnetic layer 115', through the dominant spacer layer 116', to the free layer 117'. To read the magnetic element 112', the bit line 106' is voltage clamped at a constant voltage while the source line 104' is set at a lower voltage, such as ground. The voltage difference between the bit line 106' and the source line 104' is distributed between the magnetic element 112' and the transistor 120'. The voltage of the bit line 106' is chosen such that the bias voltage (Vread) on the magnetic element is in the range of one hundred to five hundred millivolts, where the magnetic element 112' has the largest signal output. When Vread is applied to the magnetic element 112', the current flowing through the magnetic element is in the distribution 97 if the magnetic element is in its low resistance state and in the distribution 98 if the magnetic element is in its high resistance state. In this case, the read current for the distribution 98 reinforces the high resistance state. However, the read current in the distribution 97 disturbs the low resistance state. The read disturb probability is determined by the lower ratio of the maximum read current I3 to the minimum write current I1. Thus the margin between the writing and reading current is increased for the STT-RAM 100'.

Thus, the STT-RAMs 100/100' drive the write current through the magnetic element 112/112' of the magnetic storage cell 110/110' in a direction that depends upon the ratios of the minimum write currents I1 and I2 and the maximum read currents I3 and I4. Consequently, the margin between reading and writing may be improved for the STT-RAMs 100/100'.

As described above with respect to FIG. 5, an STT-RAM, such as the STT-RAMs 100/100' contains millions to thousands of millions of magnetic elements. Process variations generally cause the write and read currents of the magnetic elements 112/112' within a STT-RAM 100/100' to have a distribution range. Because of such variations, some magnetic elements 112/112' in an STT-RAM 100/100' having write currents less than I2 and more than I3. These are called tail distribution bits, or outliers. In addition, thermal affects may cause a widening of the write current distributions 95 and 96. When the switching time is greater than approximately ten nanoseconds the magnetic switching process is fundamentally a thermally assisted process, regardless of whether the magnetic element 112/112' is switched by a magnetic field or by a spin polarized electrical current through the spin torque transfer effect. Because of the large number of magnetic memory elements 112/112' used in a single STT-RAM 100/100, and the large number of operating cycles for the whole period of the device product life, thermal assisting can cause the switching writing current for a magnetic element 112/112' to be much lower than its typical value during a particular cycle. Consequently, the read current is preferably lower than the occasional low writing current of the outliers and/or other mechanisms are used to account for these outliers.

Figure 8:
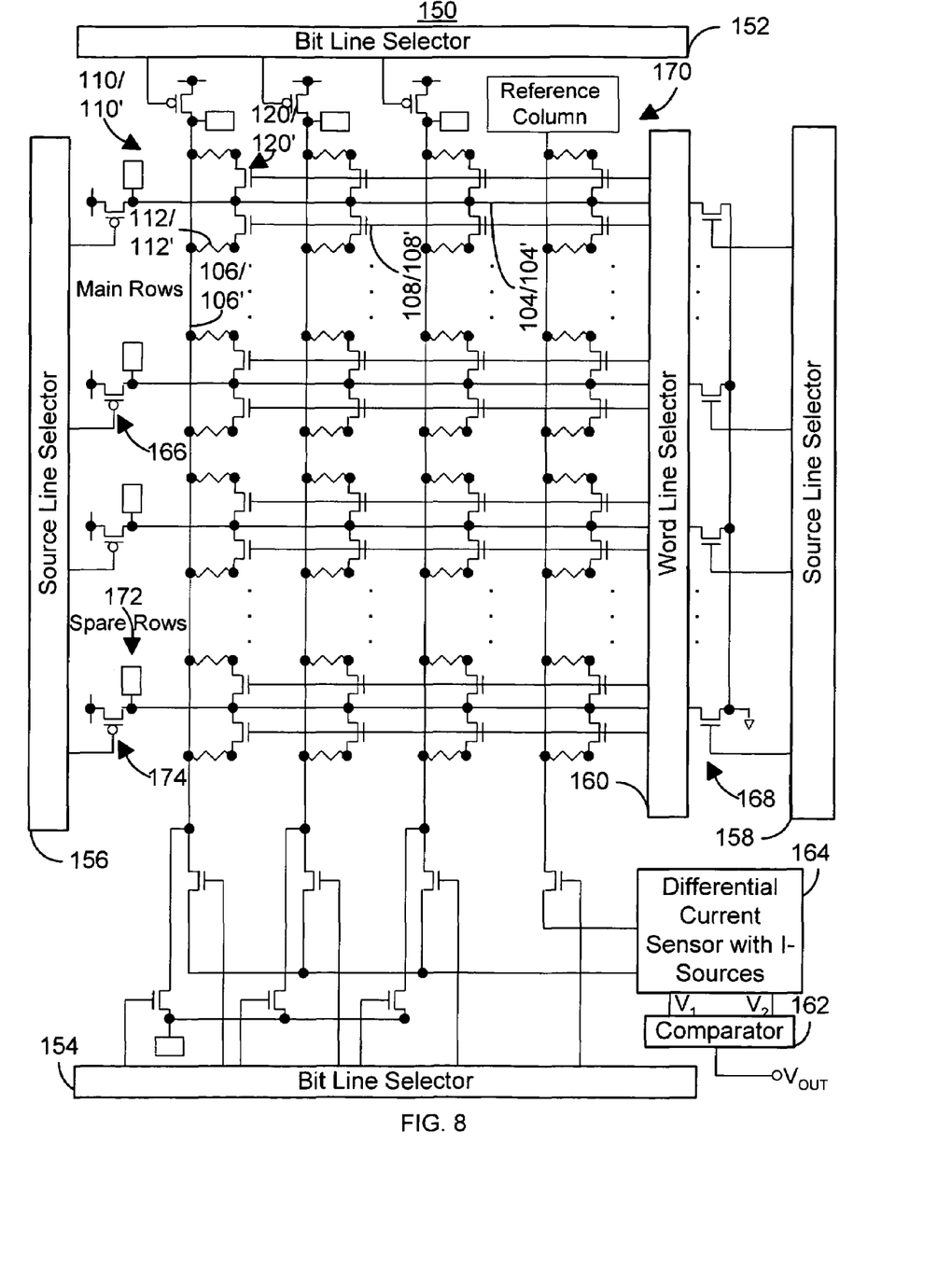
FIG. 8 is a diagram depicting another embodiment of a larger portion of a STT-RAM in accordance with the present invention including spare rows.

FIG. 8 is a diagram depicting another embodiment of a larger portion of a STT-RAM 150 in accordance with the present invention including spare rows. The STT-RAM 150 preferably utilizes the magnetic storage cell 110 and/or 110' and thus corresponds to the STT-RAM 100 and/or 100'. Thus, the direction the read current is driven through the magnetic elements 112/112' of the STT-RAM 150 depends upon the ratios of the maximum read current and the minimum write currents. The portion of the STT-RAM 150 depicts the circuitry of one input/output (or 10) block. A memory may include at least eight blocks. The STT-RAM 150 includes first bit line selector 152, second bit line selector 154, first source line selector 156, second source line selector 158, word line selector 160, comparator 162, differential current sensor with current sources 164, transistor switches 166 and 168, reference column 170, spare row(s) 172 and spare row switch(es) 174. The STT-RAM 150 includes magnetic storage cells 110/110' having magnetic elements 112/112' and selection devices 120/120', bit lines 106/106', and source lines 104/104'. In addition, the STT-RAM 150 preferably has five hundred, one thousand and twenty or more main memory rows and multiple spare row(s) 172. In some embodiments, the STT-RAM 150 includes four, sixteen, sixty-four, or another number of spare row(s) 172.

Thus, the STT-RAM 150 shares the benefits of the STT-RAM 100/100'. In particular, the STT-RAM 150 may have improved margins between read and write currents. In addition, the STT-RAM 150 may use the spare row(s) 172 to replace outlier bits. During wafer level memory die testing, varying writing pulse magnitudes in conjunction with a reading operation are used to determine the bits that are written below a pre-determined minimum writing current level, and also the bits that do not write even with a pre-determined maximum writing current level. These bits are considered writing outliers. The row(s) that contain these outlier bits can then be substituted with good spare row(s) 172 by activating latch switches 174 and 168 for the word line selector 160 and the source line selectors 156 and 158. In this manner, the wafer yield can be enhanced.

Figure 9:
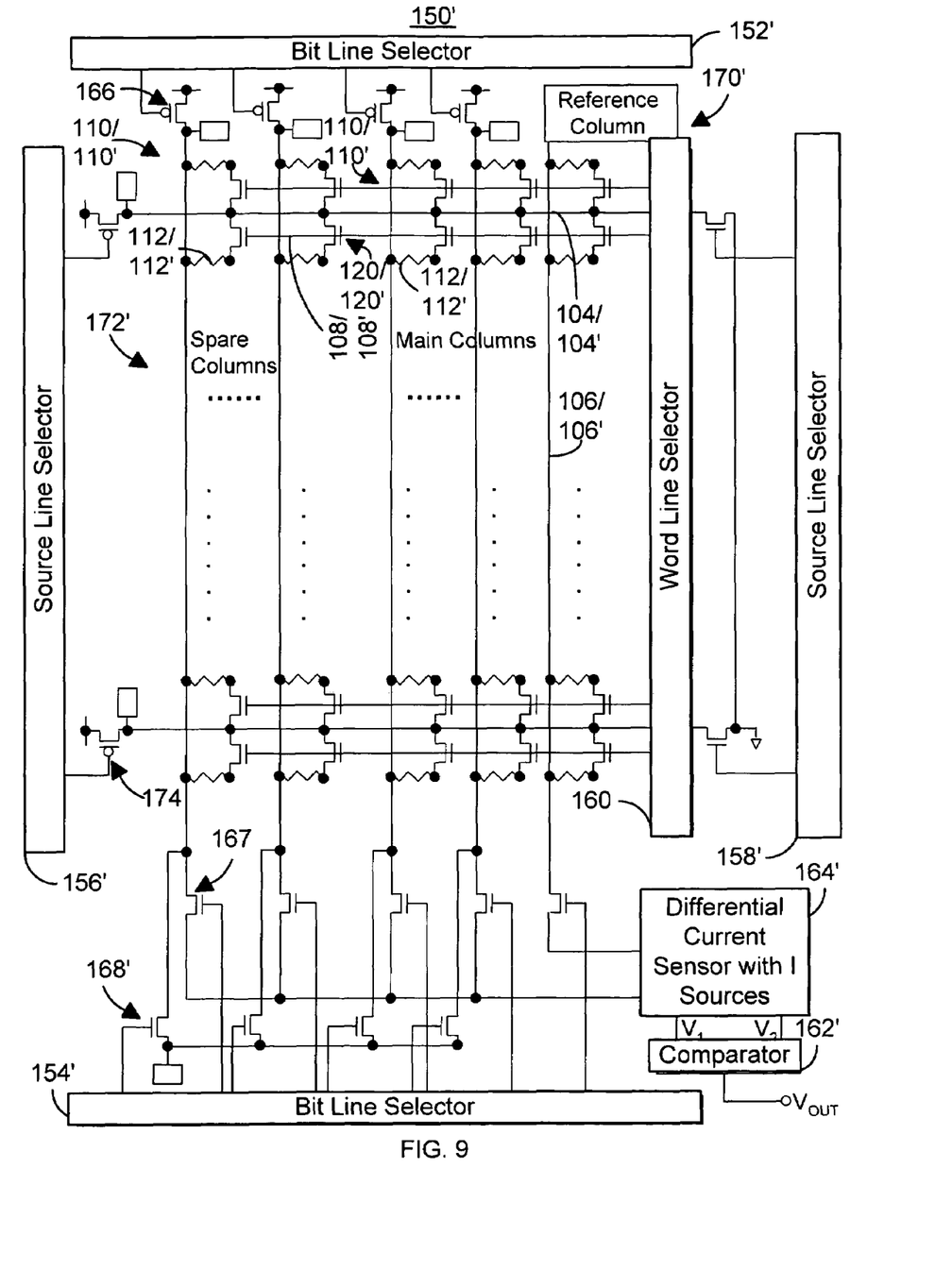
FIG. 9 is a diagram depicting another embodiment of a larger portion of a STT-RAM in accordance with the present invention including spare columns.

FIG. 9 is a diagram depicting another embodiment of a larger portion of a STT-RAM 150' in accordance with the present invention including spare columns. The STT-RAM 150' is analogous to the STT-RAM 150. Consequently, the STT-RAM 150' includes components that are labeled similar to the STT-RAM 150. The STT-RAM 150' preferably utilizes the magnetic storage cell 110 and/or 110' and thus corresponds to the STT-RAM 100 and/or 100'. Thus, the direction the read current is driven through the magnetic elements 112/112' of the STT-RAM 150' depends upon the ratios of the maximum read current and the minimum write currents. The portion of the STT-RAM 150' depicts the circuitry of one input/output (or IO) block. A memory may include at least eight blocks. The STT-RAM 150 includes first bit line selector 152', second bit line selector 154', first source line selector 156', second source line selector 158', word line selector 160', comparator 162', differential current sensor with current sources 164', transistor switches 166', 167, and 168', reference column 170', and spare column(s) 172'. The STT-RAM 150' also includes magnetic storage cells 110/110' having magnetic elements 112/112' and selection devices 120/120', bit lines 106/106', and source lines 104/104'. In addition, the STT-RAM 150' preferably has five hundred, one thousand and twenty or more main memory rows and multiple spare column(s) 172'. In some embodiments, the STT-RAM 150' includes four, sixteen, sixty-four, or another number of spare column(s) 172'.

Thus, the STT-RAM 150' shares the benefits of the STT-RAM 100/100'. In particular, the STT-RAM 150' may have improved margins between read and write currents. In addition, the STT-RAM 150' may use the spare column(s) 172' to replace outlier bits. During wafer level memory die testing, varying writing pulse magnitudes in conjunction with a reading operation are used to determine the bits that are written below a pre-determined minimum writing current level, and also the bits that do not write even with a pre-determined maximum writing current level. These bits are considered writing outliers. The columns that contain these outlier bits can then be substituted with good spare column(s) 172' by activating latch switches 166', 167, and 168' for bit line selectors 152' and 153'. In this manner, the wafer yield can be enhanced.

In addition to using the spare column(s) 172' to compensate for known bad bits such as the writing outliers, the spare column(s) 172' might be used as checker bits in an error code correction scheme to overcome occasional errors in the circuit 150'. The errors may due to a number of reasons, for example due to a read current and thermally assisted switching. For example, error checking may be used for certain designs in which the ratio between reading and writing currents (I3/I1 or I4/I2) is not sufficiently low to ensure that a reading current disturb event may never happen during the practical life of the memory device. For an eight-bit memory, the number of extra columns 172' for every eight columns is preferably three because there are 2 to the $3^{rd}$ power of combinations of states between "0" and "1". For a 16-bit memory, the number of extra columns for every sixteen columns is preferably four because there are 2 to the $4^{th}$ power of combinations of states between "0" and "1". For a 64-bit memory, the number of extra columns for every 64 columns is preferably 6 because there are 2 to the $6^{th}$ power of combinations of states between "0" and "1". Adding error correction does increase the chip size, and slows down memory speed, but it may be used to produce a robust and reliable Spin RAM chip.

Figure 10:
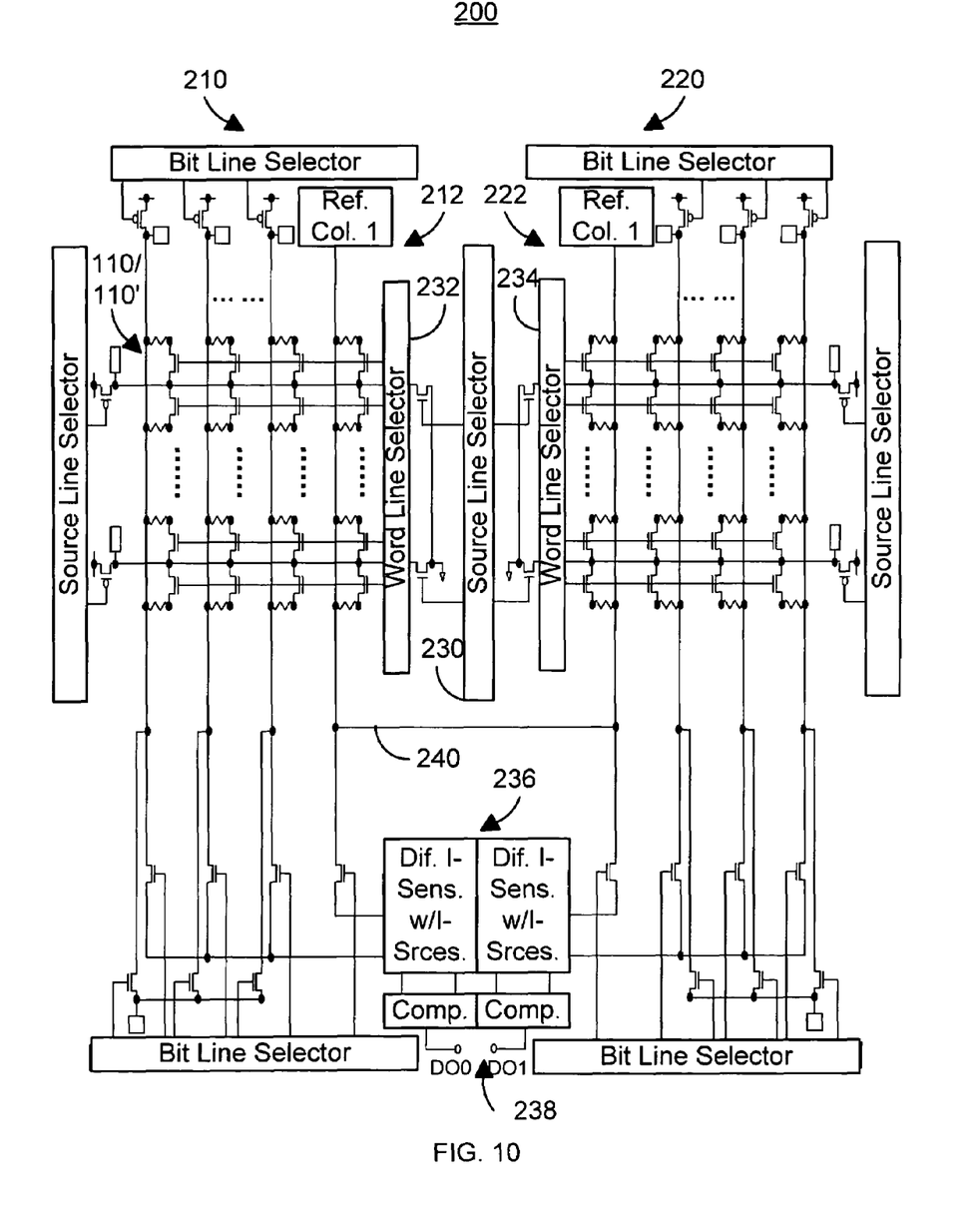
FIG. 10 is a diagram depicting another embodiment of a larger portion of a STT-RAM in accordance with the present invention.

FIG. 10 is a diagram depicting another embodiment of a larger portion of a STT-RAM in accordance with the present invention. The circuit block in FIG. 10 contains two IO blocks 210 and 220 next to each other in a mirror image fashion sharing a common source line selector 230. The blocks 210 and 220 are preferably analogous to the magnetic memory 150/150'. Also shown are word lines selectors 232 and reference columns 212 and 222. Although two word line selectors 232 and 234 are shown, in an alternate embodiment, only one word line selector might be used. In addition, the line 240 connecting the reference columns 212 and 222. The magnetic elements used for the first reference column 212 and the second reference column 222 are preferably the same as the magnetic elements 112/112' previously depicted. Thus, the magnetic elements in the reference columns 212 and 222 are preferably manufactured with the same process as the rest of the magnetic elements in the memory array 200. Consequently, the reference magnetic elements in the reference columns 212 and 222 track variation of the (remaining) main memory magnetic elements.

As discussed above, the magnetic elements 112/112' are programmed by driving write current through the magnetic elements 112/112'. Thus, the magnetic elements 112/112' in one of the reference columns 212 and 222 can be all set at the minimum resistance state. In addition, magnetic elements in the other reference column 222, 212 can all be set at the maximum resistance state. Thus, for example, the magnetic elements 112/112' in the reference column 212 may be set to a high resistance state, while the element 112/112' in the reference column 222 may be set to a low resistance state. Due to the extra connection wire 240 provided between the two reference columns 212 and 222, each differential current sensor 236 senses the average current of the magnetic elements 112/112' in both reference columns 212 and 222.

Thus, the magnetic memory 200 shares the benefits of the magnetic memories 100/100', 150/150'. In addition, the configuration of the reference columns 212 and 222 and the connecting wire 240 provides an average current value required. Thus, the reference columns 212 and 222 together provide reference signals to both magnetic elements in both blocks 210 and 220.

Figure 11:
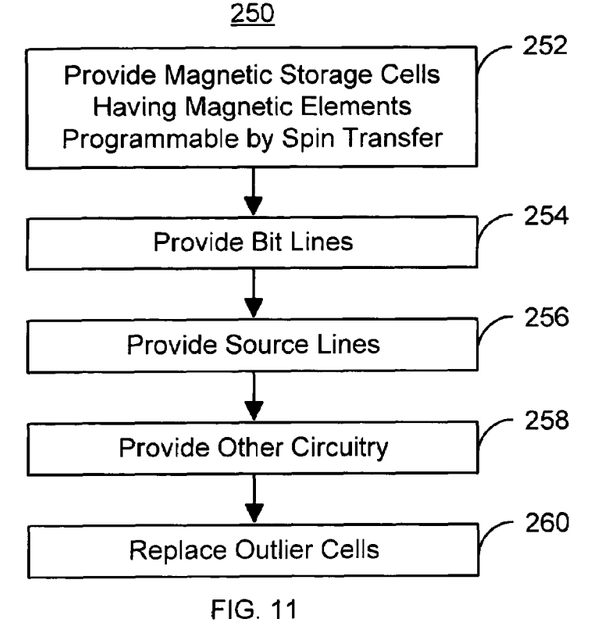
FIG. 11 is a flow chart depicting one embodiment of a method in accordance with the present invention for providing a STT-RAM.

FIG. 11 is a flow chart depicting one embodiment of a method 250 in accordance with the present invention for providing a STT-RAM. For clarity, the method 250 is described in the context of the STT-RAM 150/150'. The magnetic storage cells 110/110' are provided in the array, via step 252. The bit lines are provided, via step 254. In addition, source lines 104/104' are provided, via step 256. Other circuitry may also be provided, via step 258. Thus, the word lines 120/120', bit line selectors 152/152' and 154/154', word line selector(s) 150, and other circuitry are provided, via step 258. Outlier bits may be detected and replaced, via step 260. Step 260 may include detecting both those magnetic storage cells having too high or low a write current as well as too high or low a read current. Thus, using the method 250, the desired magnetic memories 100, 100', 150, 150', and 200 may be provided. Consequently, improved read and write margins and improved yield.

Figure 12:
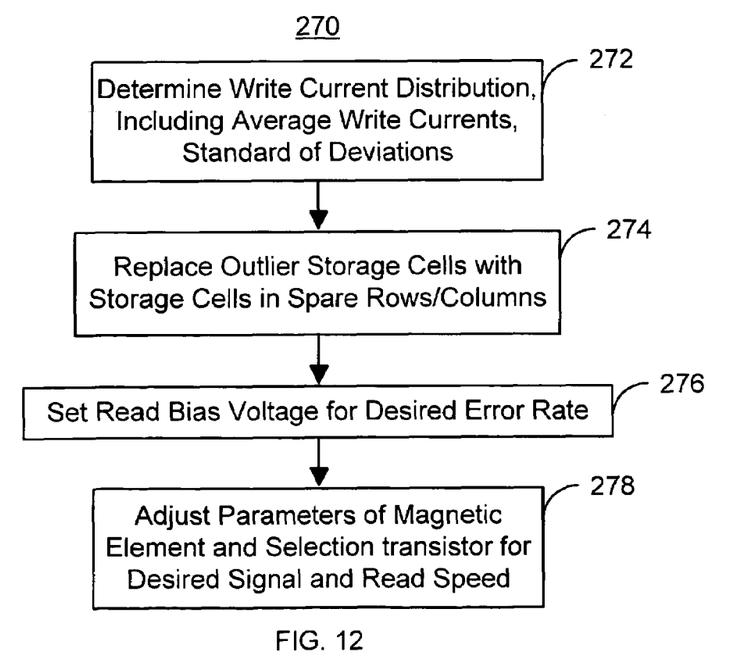
FIG. 12 is a flow chart depicting one embodiment of a method in accordance with the present invention for providing replacing outlier cells in a STT-RAM.

FIG. 12 is a flow chart depicting one embodiment of a method 270 in accordance with the present invention for providing replacing outlier cells in a STT-RAM. The method 270 may be used for step 260, described above. Referring back to FIG. 12, for clarity, the method 270 is described in the context of the magnetic memory 150. The STT-RAM 150 is tested to determine the bit write current distribution, and the location for the bits which are either electrical bad bits, i.e. open or shorted bits, or outlier bits having writing currents above a particular value or below another value, via step 272. In a preferred embodiment, it is determined whether the magnetic storage cell requires a write current that is at least five sigma (standards of deviation) away from (above or below) the average write current. Thus, a determination of the write current distribution may include determining the standard of deviation, average, mean, and other aspects of the write current. In one embodiment, the read current distribution is also determined in step 272. These bad bits and outlier bits are replaced with good redundancy bits from the spare row(s), via step 274. In a preferred embodiment, this may simply include enabling the appropriate switches, such as switches 168 and 174. The read bias voltage over the magnetic element 112/112' and transistor 120/120' is set such that the read current is below a limit value to keep read disturb error rate under an acceptable rate, such as one FIT (failure in time), via step 276. In some embodiments, two models might be used to calculate allowable maximum read current to satisfy the low read disturb error rate of, for example, one FIT. In the first method, the easiest to write bit is considered with a writing current of Iw(average)-4.5 σ. Its switching probability is calculated from the following formula, $$P\left(\frac{I}{I_0}\right) = \Delta \frac{t_p}{t_0 \exp\left(\Delta\left(1 - \frac{I}{I_0}\right)\right)} \exp\left(\frac{-t_p}{t_0 \exp\left(\Delta\left(1 - \frac{I}{I_0}\right)\right)}\right)$$

The failure rate may be plotted based upon the switching probability. From the failure rate, a maximum read current can be determined. The second method calculates the read disturb probability as a function of current. First, assume the distribution of bits form a normal distribution of the thermal stability factor $\Delta$, given $\Delta$, distribution $\sigma$, $I_0$, intrinsic switching time $t_0$, and pulse width $t_p$, to calculate the probability function using numerical integration method.

In addition, process and design parameters are optimized about the magnetic element 112/112' and the transistor 120/120' so that desired (preferably maximum) signal may be obtained as well as the desired read speed, via step 278. Thus, a magnetic memory 100, 100', 150, 150', and/or 200 having enhanced read and write margins and improved yield may be fabricated.

A method and system for providing and using a magnetic memory having an improved read and write margins has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A magnetic memory comprising:
a plurality of magnetic storage cells in an array, each of the plurality of magnetic storage cells including at least one magnetic element, the at least one magnetic element being programmable by at least one write current driven through the magnetic element, each of the at least one magnetic element having at least one free layer, a dominant spacer, and at least one pinned layer, the plurality of magnetic storage cells having a maximum high resistance state read current, a maximum low resistance state read current, a minimum high resistance state write current, and a minimum low resistance state write current, the plurality of magnetic storage cells being read by at least one read current,
a plurality of bit lines corresponding to the plurality of magnetic storage cells; and
a plurality of source lines corresponding to the plurality of magnetic storage cells;
wherein the plurality of magnetic storage cells, the plurality of source lines and the plurality of bit lines are configured such that at least one of the at least one read current flows from the at least one free layer to the dominant spacer if the maximum low resistance state read current divided by the minimum high resistance state write current is greater than the maximum high resistance state read current divided by the minimum low resistance state write current and the at least one read current flows from the dominant spacer to the at least one free layer if the maximum low resistance state read current divided by the minimum high resistance state write current is less than the maximum high resistance state read current divided by the minimum low resistance state write current.

2. The magnetic memory of claim 1 further comprising:
a plurality of reference cells corresponding to the plurality of magnetic storage cells;
at least one reference bit line corresponding to the plurality of reference cells; and
a plurality of source lines corresponding to the plurality of reference cells, the plurality of bit lines and the plurality of source lines are configured to drive a reference read current through the plurality of reference cells.

3. The magnetic memory of claim 2 wherein the plurality of reference cells are arranged in a plurality of columns.

4. The magnetic memory of claim 3 wherein at least one of the plurality of columns is designated a redundant column, replacing a portion of the plurality of magnetic storage cells including at least one outlier cell.

5. The magnetic memory of claim 4 wherein at least one the outlier cell has a write current that is not within a predetermined amount of a mean write current.

6. The magnetic memory of claim 5 wherein the predetermined amount is at least 4.5 $\sigma$.

7. The magnetic memory of claim 3 wherein at least one of the plurality of columns is configured to store error correction data.

8. The magnetic memory of claim 3 wherein the plurality of columns includes a first column and a second column, the plurality of reference cells including a reference element programmable to by the at least one write current driven through the reference, the reference element having the at least one free layer, the dominant spacer, and the at least one pinned layer, the reference element being read by the at least one read current, the first column including a first portion of the plurality of reference cells in the low resistance state, the second column including a second portion of the plurality of reference cells in the high resistance state, the first column and the second column being electrically connected.

9. The magnetic memory of claim 2 further wherein the plurality of reference cells are arranged in a plurality of rows.

10. The magnetic memory of claim 9 wherein at least one of the plurality of rows is designated a redundant row, replacing a portion of the plurality of magnetic storage cells including at least one outlier cell.

11. The magnetic memory of claim 10 wherein at least one the outlier cell has a write current that is not within a predetermined amount of a mean write current.

12. The magnetic memory of claim 11 wherein the predetermined amount is at least 4.5 $\sigma$.

13. The magnetic memory of claim 11 wherein the predetermined amount is at least 4.5 $\sigma$.

14. The magnetic memory of claim 10 wherein at least one the outlier cell has a write current that is not within a predetermined amount of a mean write current.

15. A method for fabricating a magnetic memory comprising:
providing a plurality of magnetic storage cells in an array, each of the plurality of magnetic storage cells including at least one magnetic element, the at least one magnetic element being programmable by at least one write current driven through the magnetic element, each of the at least one magnetic element having at least one free layer, a dominant spacer, and at least one pinned layer, the plurality of magnetic storage cells having a maximum high resistance state read current, a maximum low resistance state read current, a minimum high resistance state write current, and a minimum low resistance state write current, the plurality of magnetic storage cells being read by at least one read current,
providing a plurality of bit lines corresponding to the plurality of magnetic storage cells;
providing a plurality of source lines corresponding to the plurality of magnetic storage cells; and
providing a plurality of reference cell;
wherein the plurality of magnetic storage cells, the plurality of source lines and the plurality of bit lines are configured such that at least one of the at least one read current flows from the at least one free layer to the dominant spacer if the maximum low resistance state read current divided by the minimum high resistance state write current is greater than the maximum high resistance state read current divided by the minimum low resistance state write current and the at least one read current flows from the dominant spacer to the at least one free layer if the maximum low resistance state read current divided by the minimum high resistance state write current is less than the maximum high resistance state read current divided by the minimum low resistance state write current.

16. The method of claim 15 wherein the plurality of reference cells includes a plurality of columns; the method further comprising:
determining whether at least one outlier cell is included in the plurality of memory cells; and
designating at least one of the plurality of columns as a redundant column; and
if the at least one outlier cell exists, replacing a portion of the plurality of magnetic storage cells including at least one outlier cell.

17. The method of claim 16 wherein the at least one outlier cell determining further includes:
determining whether the at least one the outlier cell has a write current that is not within a predetermined amount of a mean write current.

18. The method of claim 16 wherein the at least one outlier cell determining further includes:
determining whether the at least one the outlier cell has a write current that is not within a predetermined amount of a mean write current.

19. The method of claim 15 wherein the predetermined amount is at least 4.5 $\sigma$.

20. The method of claim 15 further comprising:
configuring a portion of the plurality of columns to store error correction data.

21. The method of claim 15 wherein the plurality of reference cells includes a plurality of rows, the method further comprising:
determining whether at least one outlier cell is included in the plurality of memory cells; and
designating at least one of the plurality of rows as a redundant rows; and
if the at least one outlier cell exists, replacing a portion of the plurality of magnetic storage cells including at least one outlier cell.

22. The method of claim 15 wherein the predetermined amount is at least 4.5 $\sigma$.

23. The method of claim 15 further comprising:
configuring a portion of the plurality of columns to store error correction data.

24. The method of claim 15 wherein the plurality of reference cells are arranged in a plurality of rows.

25. The magnetic memory of claim 24 wherein at least one of the plurality of rows is designated a redundant row, replacing a portion of the plurality of magnetic storage cells including at least one outlier cell.

* * * * *